United States Patent
Yoshio et al.

(10) Patent No.: US 6,534,117 B1
(45) Date of Patent: Mar. 18, 2003

(54) ELECTROLESS PLATING METHOD AND ELECTROLESS PLATING SOLUTION

(75) Inventors: Akira Yoshio, Tokyo (JP); Yuji Segawa, Tokyo (JP); Naoki Komai, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/607,934

(22) Filed: Jun. 30, 2000

(30) Foreign Application Priority Data

Jul. 7, 1999 (JP) .......................................... 11-192709

(51) Int. Cl.$^7$ .............................. B05D 7/22; B05D 3/10; B05D 5/12; B05D 1/18
(52) U.S. Cl. .......................... 427/98; 427/97; 427/230; 427/306; 427/305; 427/437; 427/443.1
(58) Field of Search .............................. 427/437, 443.1, 427/305, 306, 98, 97, 230; 106/1.23, 1.24, 1.26

(56) References Cited

U.S. PATENT DOCUMENTS

| | | | |
|---|---|---|---|
| 4,265,943 A | * 5/1981 | Goldstein et al. | 427/305 |
| 4,301,196 A | * 11/1981 | McCormack et al. | 427/305 |
| 4,482,596 A | * 11/1984 | Gulla et al. | 428/131 |
| 4,695,505 A | 9/1987 | Dutkewych | 428/209 |
| 5,182,131 A | * 1/1993 | Hashimoto et al. | 427/8 |
| 5,576,052 A | * 11/1996 | Arledge et al. | 204/192.17 |

FOREIGN PATENT DOCUMENTS

GB 1283715 8/1972

* cited by examiner

Primary Examiner—Michael Barr
(74) Attorney, Agent, or Firm—Sonnenschein, Nath & Rosenthal

(57) ABSTRACT

When a barrier layer formed on a surface of a contact hole is subjected to electroless plating of copper, a salt of a metal such as gold, nickel, palladium, cobalt or platinum is added as a plating accelerator in an amount of 1 mol % or less based on a copper salt in a composition of an electroless plating solution, whereby the metal having the higher catalytic activity than copper is precipitated before precipitation of copper, and copper can then be precipitated as a good-quality plated film.

8 Claims, 4 Drawing Sheets

ELECTROLESS PLATING METHOD AND ELECTROLESS PLATING SOLUTION

RELATED APPLICATION DATA

The present application claims priority to Japanese Application No. P11-192709 filed Jul. 7, 1999 which application is incorporated herein by reference to the extent permitted by law.

BACKGROUND OF THE INVENTION

1. Field of the Invention

The present invention relates to an electroless plating method and an electroless plating solution. More specifically, it relates to an electroless plating method and an electroless plating solution which are suited for copper wiring by copper plating of contact holes or damascene interconnection in, for example, a semiconductor integrated circuit device.

2. Description of the Related Art

An aluminum alloy has been so far used as a fine wiring material of a high-density integrated circuit formed on a semiconductor wafer (hereinafter referred to as a semiconductor device). However, for further increasing the speed of the semiconductor device, copper or silver having a lower specific resistance has to be used as a wiring material.

Especially, copper has a specific resistance which is as low as 1.8 $\mu\omega$-cm, and it is thus advantageous for increasing the speed of the semiconductor device. Moreover, copper has a resistance to electromigration which is higher than that of an aluminum alloy by approximately one figure. Accordingly, it has been expected to be a material in the next generation.

A large number of contact holes or via holes (hereinafter referred to as contact holes) through which to electrically connect elements or multilayer wirings are formed in a semiconductor device. Contact holes are ordinarily formed by forming openings in interlayer insulation layers and embedding a conductive material therein.

In recent years, a single damascene method in which a groove is formed in the interlayer insulation layer and copper is embedded in the groove to form a groove wiring or a dual damascene method in which copper is embedded in a groove and an opening provided in the bottom of the groove to integrally form the groove wiring and the contact hole is being put to practical use.

As a method in which copper is embedded in a contact hole with good precision, an electroplating method has attracted much interest in recent years. A copper film formed by the electroplating method has a low impurity concentration therein and also a low resistance. Accordingly, the copper film is advantageous for increasing the speed of the semiconductor device. However, the embedding property of copper in the contact hole is greatly dependent on a step coverage of an undercoat layer (seed layer) required when forming a copper layer by an electroplating method. That is, when embedding copper in the contact hole by the electroplating method, it is required that the step coverage of the seed layer is good enough.

A copper layer formed by a sputtering method and having a thickness of approximately 100 nm has been so far used as a seed layer. Nevertheless, the step coverage of the seed layer formed by the sputtering method is, in many cases, not so good, making it difficult to uniformly form the seed layer in the contact hole. Further, when an aspect ratio of the contact hole (diameter to depth ratio of the opening of the contact hole) is more than 1:5, it is almost impossible to provide a uniform step coverage.

Accordingly, an attempt has been made to improve the step coverage by forming a seed layer through electroless plating (chemical reduction plating) of copper.

The electroless plating of copper is, however, problematic in that because of the low catalytic activity of copper itself, a film thickness required as a seed layer is hardly provided and a life of an electroless plating solution is short. Further, since copper particles are coarse, there is a problem that small voids (hollow portions) are formed between copper particles inside the film formed.

SUMMARY OF THE INVENTION

Under these circumstances, the invention aims to provide an electroless plating method and an electroless plating solution in which a good-quality film can be formed using copper in a portion having a high aspect ratio, such as a contact hole of a semiconductor device.

That is, the invention relates to an electroless plating method (hereinafter referred to as a plating method of the invention) in which when a surface of an activated product to be plated is subjected to electroless plating of copper using an electroless plating solution containing a copper salt, a chelating agent and a reducing agent, a salt of a metal such as gold, nickel, palladium, cobalt or platinum is added to the electroless plating solution as a plating accelerator in an amount of 1 mol % or less based on the copper salt in the composition of the electroless plating solution.

According to the plating method of the invention, the salt of the metal having a high catalytic activity, such as gold, nickel, palladium, cobalt or platinum is added as the plating accelerator in the specific amount of 1 mol % or less based on the copper salt in the composition of the electroless plating solution. Consequently, it is possible that at the initial stage of the electroless plating, the appropriate amount of the metal (plating accelerator) having the higher catalytic activity than copper is precipitated on the surface of the product to be plated before copper is precipitated and copper is then precipitated thereon. Thus, copper can uniformly be precipitated to form a good-quality copper-plated film. On the contrary, unless the plating accelerator is added, the copper-plated film is not uniformly precipitated because voids are formed. Further, when the amount of the accelerator exceeds 1 mol %, the copper-plated film is abnormally precipitated. At any rate, no uniform copper plating can be applied.

Moreover, the invention further provides, as a plating solution suited for practicing the plating method, an electroless plating solution (hereinafter referred to as a plating solution of the invention) in which in addition to a copper salt, a chelating agent and a reducing agent, a salt of a metal such as gold, nickel, palladium, cobalt or platinum is added as an accelerator of the electroless plating in an amount of 1 mol % or less based on the copper salt in the composition of the plating solution for subjecting a surface of an activated product to be plated to the electroless plating of copper.

PREFERRED EMBODIMENTS OF THE INVENTION

Figure 1:
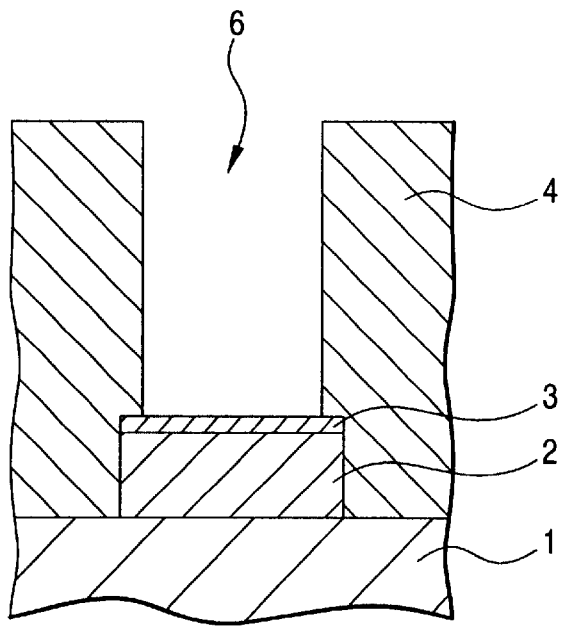
FIG. 1 is a schematic sectional view showing a step of electroless plating according to the embodiment of the invention.

In the plating method and the plating solution of the invention, it is advisable, for ensuring the functional effects, that the salt of the metal as the plating accelerator is added in an amount of 1 mol % or less based on the copper salt. Further, when the amount of copper precipitated reaches 1% by weight or more based on the copper content in the composition of the electroless solution, the salt of the metal as the plating accelerator is re-added. Then, the plating accelerator in the plating solution is maintained in the equal amount, whereby the life of the plating solution is prolonged which is advantageous for the repetitive use.

In this case, it is advisable that the amount of the salt of the metal re-added is 1 mol % or less based on the copper salt in the composition of the electroless plating solution as stated above.

It is advisable that the pH of the electroless plating solution is between 8 and 12 and the temperature of the electroless plating solution is between 20 and 60° C.

The invention is described in more detail by referring to the drawings.

Figure 2:
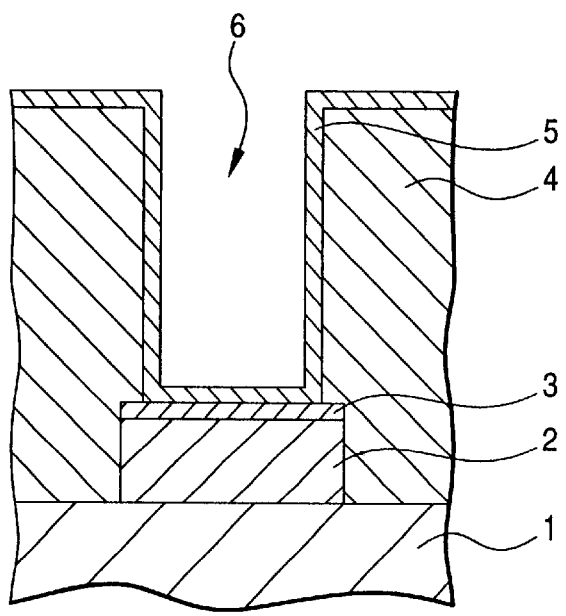
FIG. 2 is a schematic sectional view showing another step of electroless plating according to the embodiment of the invention.

First, when the electroless plating of copper is conducted in the production of a semiconductor device, tantalum nitrides as barrier layers 3, 5 are previously formed on a surface of a copper wiring 2 on a bottom of a hole 6, a contact hole as shown in FIG. 1 and on a wall surface of the hole 6 as shown in FIG. 2.

That is, on the copper wiring 2 formed on a wafer 1 by etching, an insulating layer 4 of $SiO_2$ is laminated, the contact hole 6 is then further formed by etching, and a barrier layer is formed thereon.

However, an organic contaminant formed from an organic gas slightly contained in air of a vacuum device or a clean room in a preliminary process is, in many cases, monomolecularly adhered to these barrier layers.

Accordingly, in order to form a copper wiring layer by an electroless plating method, it is advisable that a surface to be plated (surface of a barrier layer) is subjected to catalyst activation treatment (pretreatment) by the following methods (1) to (5) using a metal having a high catalytic activity, such as Pd.

(1) Removal of an Organic Material

A contaminant made of an organic material on a surface to be plated is removed by $UV/O_3$ (ultraviolet rays/ozone) treatment, plasma ashing or $O_3$ water treatment.

(2) Treatment for Imparting a Hydrophilic Nature

A surface of a metal or an oxide in a barrier layer is oxidized in water to render it hydrophilic and form —OH thereon. The treatment method can be a method in which treatment for imparting a hydrophilic nature, such as $O_3$water treatment noted in (1), mixture of sulfuric acid and hydrogen peroxide treatment, hypochlorous acid treatment, mixture of ammonia solution and hydrogen peroxide treatment or ammonium permanganate treatment can be conducted.

(3) Coupling Treatment

A Pd (palladium) colloid for catalyst treatment in the next step and a surface to be plated are adhered using a silane coupling agent or a titanium coupling agent. The silane coupling agent or the titanium coupling agent allows coordinate bonding of —OH formed by the treatment (2) and further covalent bonding of a Pd colloid for catalyst activation treatment in the next step. Thus, the agent acts to enhance the adhesion therebetween.

(4) Catalyst Treatment

A colloid of a metal having a high catalytic activity, such as Pd is fixed on a surface to be plated using Catalyst 9F made by Shipley or Enplate Activator 444 made by Enthone OMI.

(5) Activation Treatment

The surface of the Pd colloid fixed in (4) is activated using Accelerator 19 or Accelerator 240 made by Shipley to expose the surface of Pd. Copper reduced can be precipitated on this Pd exposed.

An organic contaminant other than a monomolecular film is not inherently adhered to a wafer surface at a production level. Thus, the organic material adhered to the barrier layer can be removed by wet treatment using ozone water of room temperature having a concentration of 0.5 ppm or more, preferably 5 to 15 ppm with, for example, a spin cup at a flow rate of 1 to 30 liters/min for approximately 10 seconds to approximately 20 minutes. In this case, it is more effective that a ultrasonic wave is applied, making it possible to shorten the treatment time. In the removal of the organic contaminant, other dry treatments such as ozone water treatment under ultraviolet irradiation and oxygen plasma ashing treatment may be conducted previously.

The treatment of oxidation in water is conducted for oxidizing the surface of the metal constituting the wiring 2 on the bottom of the barrier layer 5 or the hole 6 or/and its compound in water to render it hydrophilic and effectively form —OH on the surface. Accordingly, in the ozone water treatment, it is most preferable that the reaction occurs simultaneously with the treatment of removing the organic material. When the treatment of removing the organic material is dry treatment, any product capable of oxidizing the metal constituting the barrier layer or its compound, or any treatment method such as ozone water treatment, mixture of sulfuric acid and hydrogen peroxide treatment, hypochlorous acid treatment or ammonium permanganate treatment, is available.

The treatment of reacting —OH formed by the oxidation treatment in water with the coupling agent for chemical bonding may be conducted using a silane coupling agent or a titanium coupling agent. It is preferably a compound having a group capable of coordinate bonding with, for example, tin for protecting a Pd colloidal catalyst used in the subsequent process, such as an amino group or a thiol group in a molecular chain of a hydrocarbon or/and in the opposite end to an Si or Ti atom.

Further, raised and depressed portions are formed on the surface treated through silane coupling or titanium coupling by the molecular size to roughen the surface. Accordingly, it is sufficient to maintain such a hydrophilic nature that a colloid of a catalyst metal in the subsequent process is adsorbed on the thus-treated surface. This silane coupling agent or titanium coupling agent is typified by a compound containing —OH, —COOR or —OR group (R is an alkyl group) in the molecular chain or in the end.

It is advisable that by the treatment with the colloidal solution of a catalyst metal, for example, palladium protected with stannous chloride, the tin atom of stannous chloride as the protecting agent of the palladium colloid is coordinate-bonded to the amino group or the thiol group of the silane coupling or the titanium coupling to bond the palladium colloid.

That is, the Pd colloidal solution protected with stannous chloride acts on the wafer 1 after the coupling treatment, and the tin atom of the Pd colloid is coordinate-bonded to the amino group or the thiol group of the silane coupling agent or the titanium coupling agent on the wafer 1, whereby the Pd colloid can firmly be bonded.

In this case, any Pd colloidal catalyst like Catalyst 9F made by Shipley will do. Since it is used in the semiconductor process, a Pd colloidal catalyst in which a protecting agent for protecting the Pd colloid is stannous chloride is preferable.

Excess stannous chloride which is not coordinate-bonded to the surface of the wafer 1 is washed away with an aqueous solution of $HBF_4$ (hydrofluoric acid) or $H_2SO_4$ (sulfuric acid) to expose Pd and complete the pretreatment.

In the removal by washing, an activator containing $HBF_4$, such as Accelerator 19 made by Shipley is most preferable in view of qualities and performance. Meanwhile, a sulfuric acid activator such as Accelerator 240 is more preferable in view of the environment, though it is somewhat problematic in qualities and performance.

In the product obtained by only causing the Pd colloidal solution to act on the wafer 1, the Pd colloid is merely adsorbed thereon. It is, therefore, impossible to conduct the activation treatment while applying an ultrasonic wave. When the ultrasonic treatment is conducted, there is a problem that Pd is removed. However, in the preliminary treatment with the silane coupling agent or the titanium coupling agent containing —$NH_2$ or —SH and the subsequent coordinate bonding of the Pd colloid as stated above, Pd is chemically bonded to the surface and thus firmly adhered, making it possible to conduct the activation treatment while applying an ultrasonic wave. In this case, a small blind hole having a high aspect ratio of 1:4 or more and a diameter of 0.3 $\mu$m or less is also treated quite effectively, and an inside of a hole having an aspect ratio of 1:10 and a diameter of 0.18 $\mu$m can also uniformly be plated.

This pretreatment step is conducted in one and the same cup. To this end, a spin cup device capable of plural treatments in one and the same cup is preferable. A dipping bath type can also be used.

The pretreatment of the electroless plating can be applied to not only the wiring process of the semiconductor wafer but also to the surface treatment of all metals and inorganic materials. Thus, strong, precise plating with a high covering power can be realized without the roughening treatment.

In this case, it is advisable to use an electroless plating solution containing a copper salt, an ampholytic chelating agent such as glycine, an ammonium salt-type chelating agent such as ammonium succinate, a reducing agent such as ammonium hypophosphite, and a nonionic, cationic or ammonium salt-type anionic surface active agent.

That is, it is possible that a copper salt (chloride or sulfate), an ampholytic chelating agent such as glycine and an ammonium salt-type chelating agent such as ammonium succinate or ammonium malate are mixed and the pH of the mixture is adjusted with ammonia water, and that an alkali metal ion-free reducing agent such as ammonium hypophosphite, hypophosphorous acid, ammonium borohydride or hydrazine, and a nonionic, cationic or ammonium salt-type anionic surface active agent are used.

After the completion of this pretreatment, the semiconductor device is dipped in the copper electroless plating solution according to the invention. The preferable composition of the electroless plating solution is as follows.

copper chloride (copper salt):
    5 to 50 g/liter, for example, 10 g/liter (copper sulfate, copper nitrate or copper sulfamate is also available)
nickel chloride (plating accelerator):
    1 mol % or less, for example, 1 mol % based on copper chloride (nickel sulfate, nickel nitrate or nickel sulfamate is also available)
ethylenediamine (chelating agent):
    20 to 40 g/liter, for example, 30 g/liter [EDTA (ethylenediaminetetraacetic acid) is also available]
cobalt nitrate (reducing agent):
    25 to 250 g/liter, for example, 40 g/liter With respect to the agents shown in brackets, it is necessary to determine the weight corresponding to the number of mols of copper chloride or ethylenediamine when they are used.

It is further preferable that the temperature of the plating solution is between 20 and 60° C., for example, 50° C. and the pH thereof is between 8 and 12, for example, 9. When the plating is conducted within these ranges, the stable copper-plated film can be formed by preventing the peeling of the film, the abnormal precipitation (precipitation on positions other than the surface to be plated, for example, precipitation on an inner wall of a plating bath) and sedimentation.

In the composition of the plating solution, the Ni (nickel) salt is added in the small amount of 1 mol % or less. This amount is appropriate for realizing the uniform electroless plating of copper. As a result, there are effects that a dense plated film is formed without formation of voids and the life of the electroless plating solution itself is prolonged. It has been clarified by the present inventors that the qualities of the plated film are influenced by the amount of the nickel salt added.

Figure 6:
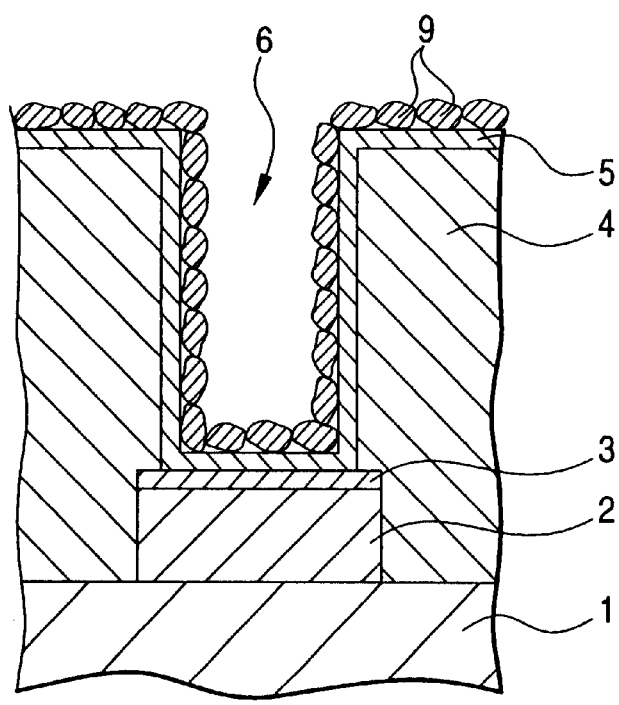
FIG. 6 is a schematic sectional view showing a state in which a copper-plated film obtained by electroless plating is not uniformly formed.

That is, when the nickel salt is not added at all, copper 9 is grown in particulate form, as shown in FIG. 6, with copper precipitated on the Pd catalyst layer of the barrier layer 5 in island state as a core. Consequently, voids are formed between copper particles 9. Thus, no dense plated film can be formed, and the adhesion is clearly poor.

Figure 7:
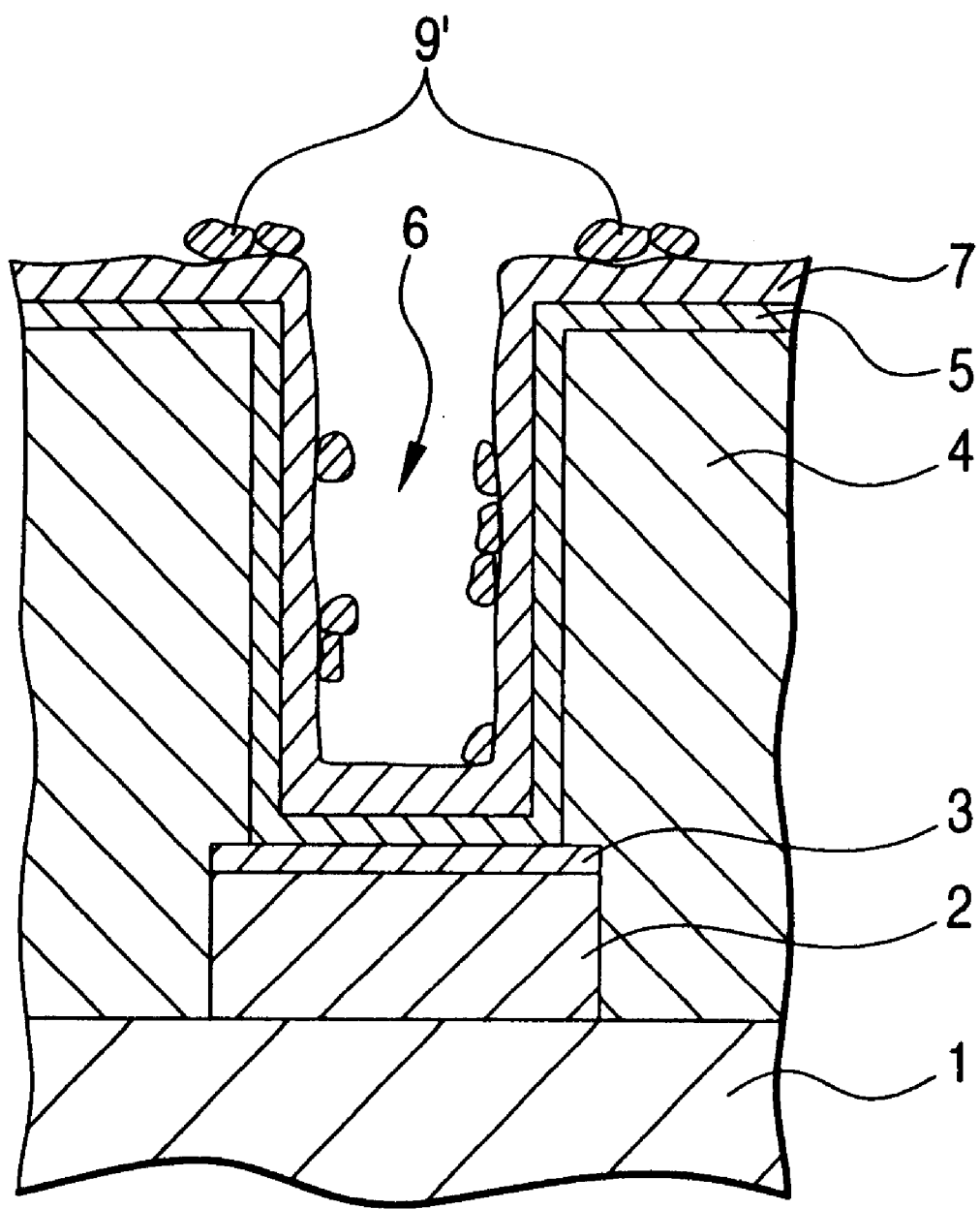
FIG. 7 is a schematic sectional view showing a state in which copper is abnormally precipitated on a copper-plated film obtained by electroless plating.

Further, when the amount of the nickel salt added is larger than 1 mol % based on the copper salt in the electroless plating solution, abnormal copper precipitates 9' are formed on the surface of the resulting copper-plated film 7 as shown in FIG. 7, and this is not practical.

Figure 3:
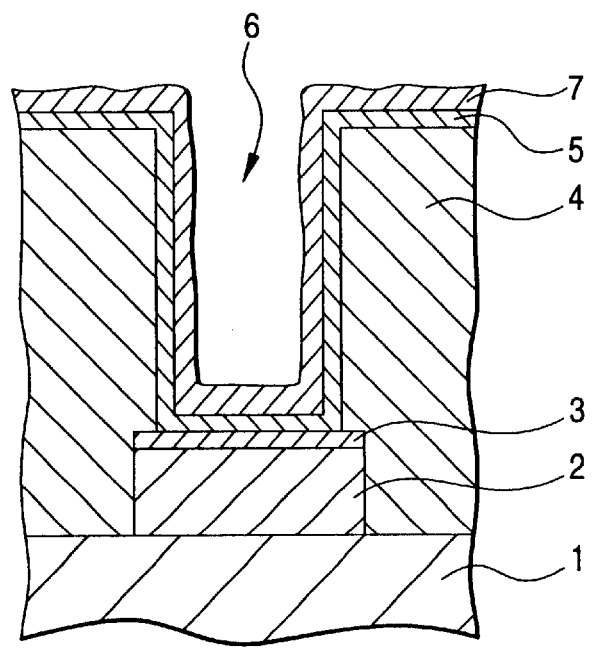
FIG. 3 is a schematic sectional view showing still another step of electroless plating according to the embodiment of the invention.

However, when the nickel salt is added in a specific amount of 1 mol % or less based on the copper salt in the electroless plating solution, a void-free dense film can be obtained as shown in FIG. 3. This is because Ni having a higher catalytic activity than copper tends to be precipitated uniformly throughout the Pd catalyst layer at the initial stage of the electroless plating.

In this case, it does not occur that the copper core 9 is formed in island state as shown in FIG. 6, but uniform precipitation of copper is started on the Pd catalyst layer.

And, copper is grown in columnar state therefrom, which results in formation of a void-free plated film 7.

Further, the addition of the small amount of the nickel salt to the electroless plating solution makes it possible to prolong the life of the plating solution by the effect of the catalyst activation and to increase the film-forming rate.

For example, when the case of adding 1 mol % of the Ni salt based on the copper salt in the electroless plating solution is compared with the case of not adding the Ni salt at all, the following results are provided.

No addition:
life: 250 cm$^2$/liter (film formation by 100 nm) film-forming rate: 15 nm/min Addition:
life: 550 cm$^2$/liter (film formation by 100 nm) film-forming rate: 30 nm/min These results reveal that the life and the film-forming rate in the addition of the Ni salt are at least twice as much as those in no addition.

Further, the effect of the small amount of the Ni salt added for forming the uniform copper plated film 7 as shown in FIG. 3 is gradually decreased from the stage in which more than 1% by weight of the Ni salt based on the copper content in the electroless plating solution is precipitated.

Accordingly, a void-free uniform copper plated film can continuously be formed with the effect of the additional catalyst activation by re-adding the Ni salt to the electroless plating solution in the same amount (namely, 1 mol % or less) as at the initial stage. This re-addition of the Ni salt can be repeated so long as the effect is continued. However, the number of re-additions greatly depends on the composition of the original electroless plating solution.

The ammonium salt is all used in the chelating agent, the reducing agent (hypophosphorous acid) and the surface active agent (anionic type), and ammonia water is used to adjust the pH. However, the following composition is also available.

copper chloride 10 to 100 g/liter
(copper sulfate or copper sulfamate is also available.)
glycine 2 to 50 g/liter
(ampholytic chelating agent such as another amino acid)
ammonium succinate 2 to 50 g/liter
(ammonium salt of malic acid, citric acid, malonic acid or formic acid)
ammonium hypophophite 2 to 50 g/liter
(hypophosphorous acid, hydrazine or ammonium borohydride)
ammonia water 5 to 200 ml/liter
(pH is adjusted to a necessary value in the range of 8 to 12.)
ammonium laurylsulfate 0.1 to 20 mg/liter
(When a pH is in the acidic region, a cationic activator is available; when a pH is in the alkaline region, an anionic activator is available; and when a pH is in an ampholytic region, a nonionic activator is available.)

It is advisable that the amount of a metal salt having a catalytic activity, such as nickel, cobalt, palladium or gold as a plating (reaction) accelerator is 1 mol % or less based on the copper salt.

It is effective that in each of the steps, the treatment in at least a wet state is conducted under action of an ultrasonic wave. To this end, it is recommendable that each step is conducted in one and the same chamber using a spin cup-type or dipping bath-type device and a treating solution is spread on a product to be plated while rotating the same, or the product to be plated is dipped in the treating solution after the treatment and further heated to a predetermined temperature.

It is advisable that washing water containing 1% or less of dissolved oxygen is used in the washing after the treatment. That is, the ratio of dissolved oxygen is decreased to 1% or less in the washing water, making it possible to prevent the oxidation of the plated film and increase the conductivity. It is further advisable to conduct the baking treatment after the electroless plating.

The plating method and the plating solution according to the invention can make the diameter of the hole 0.25 μm or less and the aspect ratio 5 or more. The results that the diameter of the hole is 0.13 μm and the aspect ratio is 10 or more are also provided. Further, there is a possibility of providing higher-level results. For example, even when the aspect ratio of the contact hole is 1:10 (for example, an opening diameter of 0.1 μm and a depth of 1 μm), a uniform copper layer having a good step coverage can be formed.

In the foregoing embodiment, the Ni salt is added for the effect of the catalyst activation. The same effect can also be obtained when a salt of a metal having a higher catalytic activity than copper, such as gold, palladium, cobalt or platinum is added.

Figure 4:
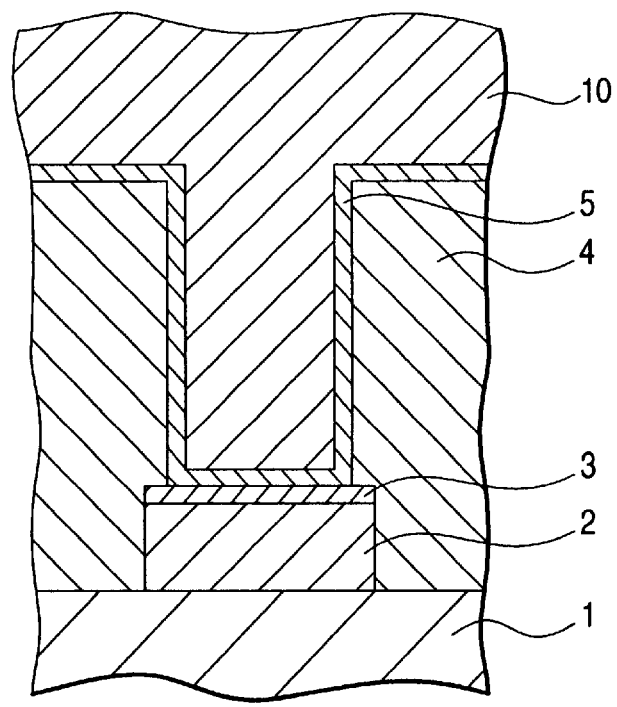
FIG. 4 is a schematic sectional view showing the other step of electroless plating according to the embodiment of the invention.
Figure 5:
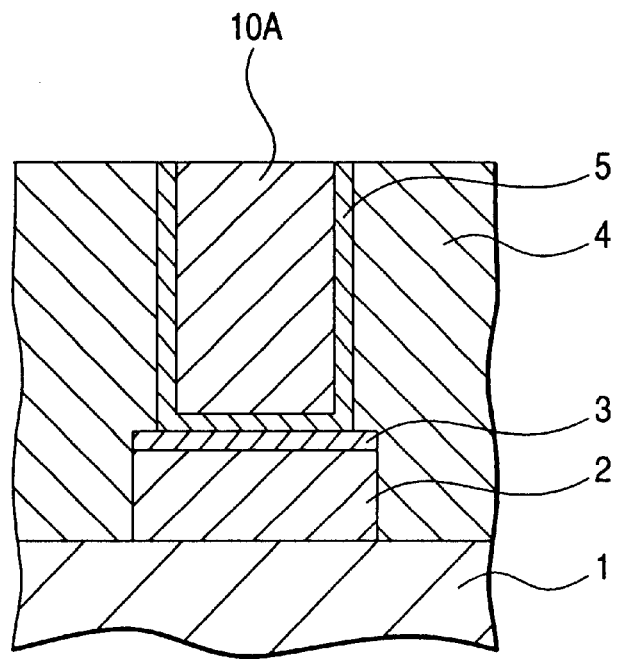
FIG. 5 is a schematic sectional view showing the other step of electroless plating according to the embodiment of the invention.

Not only is the copper layer 7 formed by the electroless plating as the seed layer, but also the whole of the contact hole is filled with a copper-plated film 10 as shown in FIG. 4. In this case, as shown in FIG. 5, the completely filled flat copper wiring 10A can be formed by polishing the upper portion. In this instance, copper provided by the electroless plating is harder than copper provided by electroplating, and the resistance to electromigration can be enhanced.

Moreover, the invention can be used in not only the semiconductor device but also a copper wiring for a circuit substrate, and the plating solution can be replaced with an electroless plating solution containing a reducing agent different from the above-mentioned reducing agent.

According to the foregoing embodiment, since the nickel salt having the higher catalytic activity than copper is added as the plating accelerator in the appropriate amount based on the copper salt, the void-free dense copper film can be formed by the electroless plating, providing the following effects.

(1) The formation of the seed layer with copper on the contact hole of the semiconductor device and the filling of copper therein can uniformly be conducted without occurrence of voids, and the adhesion to the surface to be plated is improved.

(2) The addition of the small amount of the Ni salt can improve the life and the film-forming rate of the electroless plating solution by two or more times.

(3) The re-addition of the Ni salt in the life of the electroless plating solution enables the prolongation of the plating solution and the repetitive use thereof.

(4) The formation of the copper seed layer and the copper filling by the electroless plating make the film harder than by the electroplating, and the resistance to electromigration is increased.

(5) Since the electroless plating method is not the electroless plating method using formalin as the reducing agent, the influence to the human bodies and the environment is reduced, and it can also be applied to a copper wiring for a circuit substrate.

This embodiment can variously be modified on the basis of the technical concept of the invention.

For example, the components of the plating solution, such as the copper salt, the plating accelerator, the reducing agent, the chelating agent and further the pretreatment agent are not critical, and those having the same abilities are also available. Further, the electroless plating can be applied to not only the dual damascene and the single damascene of the integrated circuit of the semiconductor wafer but also other various wirings and all of products to be plated.

As stated above, according to the invention, when the surface of the activated product to be plated is subjected to the electroless plating of copper using the electroless plating solution containing the copper salt, the chelating agent and the reducing agent, the salt of the metal such as gold, nickel, palladium, cobalt or platinum is added as the plating accelerator to the electroless plating solution in the amount of 1 mol % or less based on the copper salt in the composition of the electroless plating solution. Consequently, at the initial stage of the electroless plating, the metal (plating accelerator) having the higher catalytic activity than copper, such as gold, nickel, palladium, cobalt or platinum is precipitated on the surface of the product to be plated in the appropriate amount. Accordingly, copper is uniformly precipitated thereon, making it possible to form the good-quality copper-plated film.

What is claimed is:

1. A method of electroless plating a surface of an activated product, comprising using an electroless plating solution for electroless plating said surface of said activated product, said electroless plating solution containing a copper salt, a chelating agent, a reducing agent, and a salt of a metal that is gold, nickel, palladium, cobalt or platinum added to the electroless plating solution as a plating accelerator in an amount of 1 mol % or less based on the copper salt in the composition of the electroless plating solution, wherein using an electroless plating solution for electroless plating said surface of said activated product comprises:

precipitating said metal on said surface of said activated product using said electroless plating solution; and precipitating copper on said metal precipitated on said surface of said activated product using said electroless plating solution, wherein holes having high aspect ratios on said surface of said activated product and the insides of said holes are also plated uniformly and at least one of said holes has a diameter of 0.3 $\mu$m or less.

2. The electroless plating method as claimed in claim 1, further comprising re-adding said salt of said metal as a plating accelerator when the amount of copper precipitated reaches 1% by weight or mote based on the copper content in the composition of the electroless plating solution.

3. The electroless plating method as claimed in claim 2, wherein the amount of the salt of the metal re-added is 1 mol % or less based on the copper salt in the composition of the electroless plating solution.

4. The electroless plating method as claimed in claim 1, wherein the pH of the electroless plating solution is between 8 and 12.

5. The electroless plating method as claimed in claim 1, wherein the temperature of the electroless plating solution is between 20 and 60° C.

6. The method of claim 1, wherein at least one of said holes has an aspect ratio of 1:4 or more.

7. The method of claim 6, wherein said at least one hole has an aspect ratio of about 1:10.

8. The method of claim 1, wherein said at least one of said holes has a diameter of about 0.18 $\mu$m.

* * * * *